United States Patent
Chan et al.

(10) Patent No.: US 12,013,323 B2
(45) Date of Patent: Jun. 18, 2024

(54) SAMPLE CELL FOR HANDLING AND MEASURING SENSITIVE SAMPLES IN LOW TEMPERATURE CONDITIONS

(71) Applicant: IQM Finland Oy, Espoo (FI)

(72) Inventors: Kok Wai Chan, Espoo (FI); Tianyi Li, Espoo (FI); Juha Hassel, Espoo (FI); Jari Penttilä, Espoo (FI)

(73) Assignee: IQM Finland Oy, Espoo (FI)

( * ) Notice: Subject to any disclaimer, the term of this patent is extended or adjusted under 35 U.S.C. 154(b) by 814 days.

(21) Appl. No.: 16/915,644

(22) Filed: Jun. 29, 2020

(65) Prior Publication Data

US 2021/0255076 A1    Aug. 19, 2021

(30) Foreign Application Priority Data

Feb. 18, 2020    (EP) .................................... 20157942

(51) Int. Cl.
| | |
|---|---|
| *G01N 1/42* | (2006.01) |
| *B08B 9/04* | (2006.01) |
| *F25D 3/10* | (2006.01) |
| *H05K 7/20* | (2006.01) |

(52) U.S. Cl.
CPC ................ *G01N 1/42* (2013.01); *B08B 9/04* (2013.01); *F25D 3/10* (2013.01); *B08B 2209/04* (2013.01); *H05K 7/20372* (2013.01)

(58) Field of Classification Search
CPC .... G01N 1/42; H05K 7/20372; F25D 19/006; H01L 23/445
See application file for complete search history.

(56) References Cited

U.S. PATENT DOCUMENTS

| | | | |
|---|---|---|---|
| 5,121,292 A * | 6/1992 | Bell | ................... H05K 7/20372 361/699 |
| 2001/0028074 A1 | 10/2001 | Yoshida et al. | |
| 2010/0242503 A1 | 9/2010 | Woidtke et al. | |

(Continued)

FOREIGN PATENT DOCUMENTS

| | | | | |
|---|---|---|---|---|
| CN | 110320389 | | 10/2019 | |
| CN | 110320389 A * | | 10/2019 | ............. G01N 21/11 |

(Continued)

OTHER PUBLICATIONS

International Search Report issued to PCT/FI2021/050102, dated May 14, 2021, 7 pages.

(Continued)

*Primary Examiner* — Lionel Nouketcha
(74) *Attorney, Agent, or Firm* — Meunier Carlin & Curfman LLC

(57) ABSTRACT

A sample cell is provided for holding a sample to be placed in a cryogenically cooled environment. The sample cell comprises an airtight, openable and closable enclosure. Within said enclosure is a sample base for receiving the sample. A refrigerator attachment is provided for attaching the sample cell to a refrigerated body of a cryogenically cooled environment. The sample cell comprises a thermal connection between the sample base and the refrigerator attachment. One or more airtight connectors are provided for establishing electric connections between inside and outside of said enclosure.

20 Claims, 4 Drawing Sheets

(56) References Cited

U.S. PATENT DOCUMENTS

| | | | |
|---|---|---|---|
| 2012/0201268 A1* | 8/2012 | Boyd .................. | G01K 13/006 |
| | | | 374/33 |
| 2014/0202179 A1* | 7/2014 | Batey .................. | F25D 29/001 |
| | | | 62/190 |
| 2021/0076530 A1 | 3/2021 | Hart | |

FOREIGN PATENT DOCUMENTS

| | | |
|---|---|---|
| EP | 0660449 | 1/1997 |
| JP | H06174193 | 6/1994 |
| JP | H11337631 | 12/1999 |

OTHER PUBLICATIONS

Lin, Meng-Yu et al. "Passivated graphene transistors fabricated on a millimeter-sized single-crystal graphene film prepared with chemical vapor deposition"; Journal of Physics D: Applied Physics Institute of Physics Publishing Ltd, GB, Jun. 30, 2015, vol. 48, No. 29, p. 295106,<DOI: 10.1088/0022-3727/48/29/295106>.

G. Batey et al., "A rapid sample-exchange mechanism for cryogen-free dilution refrigerators compatible with multiple high-frequency signal connections." Online Journal, available Jan. 24, 2014, 9 pages, www.elsevier.com/locate/cryogenics.

Extended Search Report issued to EP20157942.2dated Aug. 27, 2020, 14 pages.

\* cited by examiner

SAMPLE CELL FOR HANDLING AND MEASURING SENSITIVE SAMPLES IN LOW TEMPERATURE CONDITIONS

PRIORITY CLAIM

This application claims priority to European Patent Application No. 20157942.2, filed on Feb. 18, 2020, the entire disclosure of which is incorporated by reference herein.

TECHNICAL FIELD

The invention is generally related to the technology of sample handling in both room temperature and cryogenic environments. In particular the invention is related to protecting samples from harmful effects of environmental conditions when the samples are not undergoing active measurements in a cryogenic environment.

BACKGROUND

Many applications necessitate cooling a relatively small piece of material, often referred to as a sample, down to very low temperatures for the duration of various measurements and operation. Examples of such samples include, but are not limited to, quantum circuit elements used in quantum computing. Other examples are for example pieces of sophisticated materials like graphene, other atomic-level thin-film materials, carbon nanotubes and fullerenes, and the like. Low temperatures include temperatures that can only be achieved in cryogenic cooling systems: temperatures lower than 10 K, typically lower than 4 K, and in many cases in the order of only some millikelvins. The need to minimize conductive and convective transfer of heat necessitates creating vacuum conditions in addition to the very low temperature.

A feature characteristic in particular to quantum circuit elements, but often needed in other kinds of sample measuring applications, is the requirement of providing a number of very high frequency signal connections to and from the sample. The frequencies involved may be in the order of several GHz. The signal connections should not create any significant heat load that could make it more difficult to maintain the desired very low temperature.

It has been noticed that samples of the kind described above may undergo undesired deterioration of their characteristics if subjected to environmental conditions such as ordinary air, airborne moisture, and other impurities. A natural way to avoid such deterioration would be to manufacture the samples close to the cryostat in which the measurements are to be performed, and to insert the samples into the cryostat as quickly as possible after manufacturing. However, such close-quarter logistics are not always possible, and samples may need to be transported very long distances. Some samples also need to be held in storage for later measurements or for transportation for considerable periods of time.

SUMMARY

It is an objective to provide an arrangement for enabling the handling and measuring of samples of the kind described above with reduced risk of their characteristics deteriorating. Another objective is that the arrangement allows repeated access to the sample without sacrificing the protection provided. A further objective is to enable re-using and recycling any valuable structures and materials involved in handling and measuring the samples. A yet further objective is to provide considerable freedom in the number and structure of signal connections that can be made to the sample.

The objectives of the invention are achieved by utilizing a vacuum-tight, openable and closable sample cell for a sample, with integrated vacuum-tight signal connections and robust thermal connection to a sample enclosed in the sample cell.

According to a first aspect, there is provided a sample cell for holding a sample to be placed in a cryogenically cooled environment. The sample cell comprises an airtight, openable and closable enclosure; within said enclosure a sample base for receiving the sample; a refrigerator attachment for attaching the sample cell to a refrigerated body of the cryogenically cooled environment; a thermal connection between the sample base and the refrigerator attachment; and one or more airtight connectors for establishing electric connections between inside and outside of the enclosure.

According to an embodiment, the sample cell comprises an evacuation channel between inside and outside of the enclosure for evacuating the enclosure after closing. This provides an advantage where attaching the sample, making connections, and closing the enclosure can be made conveniently without having to pay immediate attention to very particular environmental conditions, and the sample can be subsequently isolated from harmful effects of atmospheric conditions by evacuating the enclosure.

According to an embodiment, the evacuation channel comprises a conduit through a structure of said enclosure, and the sample cell comprises a closing valve for selectively allowing and preventing flow of gaseous media through the conduit. This provides an advantage where sealing the enclosure against surrounding atmospheric conditions can be accomplished conveniently with very little external hardware.

According to an embodiment, the closing valve comprises a closing member movable between an open position and a closed position, of which in said open position said closing member allows gaseous media to flow through said conduit, and in said closed position said closing member prevents gaseous media from flowing through said conduit. This provides an advantage where a relatively simple, yet robust and reliably functioning way of closing the conduit is readily available.

According to an embodiment, the sample cell comprises a piece of deformable sealing material at such a part of the conduit that said closing member is arranged to occupy in the closed position. This provides an advantage where the closure of the conduit can be made sufficiently airtight with relatively simple mechanical means.

According to an embodiment, the closing valve comprises a cavity at an angle against said conduit, said cavity having threads, and the closing member comprises a threaded pin arranged for longitudinal movement in said threaded cavity in response to turning on said threads. This provides an advantage where a relatively simple, yet robust and reliably functioning way of closing the conduit is readily available.

According to an embodiment, the refrigerator attachment defines an essentially planar outer surface of said sample cell; the sample base defines an essentially planar inner surface of the sample cell, said inner surface being parallel with said outer surface, and the thermal connection comprises a layer of a thermally conductive material between said inner and outer surfaces. This provides an advantage where mechanically simple and easily manufactured parts can be used to implement the refrigerator attachment, the sample base, and the thermal connection.

According to an embodiment, said thermally conductive material is a material that remains thermally conductive in sub-kelvin temperatures. This provides an advantage where the sample can be cooled to even sub-kelvin temperatures while still inside and protected by the sample cell.

According to an embodiment, said thermally conductive material comprises one of the following: aluminum, copper, gold. This provides an advantage where the availability, tooling characteristics, and inherent material characteristics of the material are well known, and known to be suitable for the purpose in question.

According to an embodiment, said enclosure comprises a body part in which said sample base is located and a lid part removably attached to said body part to close an opening in said body part. This provides an advantage where the basic structure of the sample cell can be kept relatively simple without compromising the highly advantageous functional characteristics that are disclosed herein.

According to an embodiment, the sample cell comprises an electrically conductive seal between the body part and the lid part. This provides an advantage where the body part and the lid part can be used to establish a continuous, electromagnetically shielding structure around the sample in the sample cell.

According to an embodiment, the electrically conductive seal is made of a superconductive material. This provides an advantage where the seal enables creating a seamless superconductive path between parts of an openable sample cell in case superconductive materials are also used for the other parts.

According to an embodiment, the sample cell is made of a superconductive material. This provides an advantage by providing a particularly good electromagnetic shielding, including low-frequency magnetic shielding, for the sample at the eventual operating temperatures.

According to an embodiment, the sample cell comprises a handling attachment for removably attaching the sample cell to a probe for inserting the sample cell into a cryogenic cooling apparatus. This provides an advantage where the sample cell can be used in sample changes in which the whole cryogenic cooling system does not need to be intermittently thermalized and opened. According to a second aspect there is provided an arrangement for cooling a sample in a cryogenically cooled environment. The arrangement comprises a sample cell of the kind described above, a cryogenic cooling apparatus that comprises a refrigerated body, and a sample cell receiving surface of said refrigerated body for receiving said sample cell into thermally conductive contact with said refrigerated body.

According to an embodiment, said refrigerated body comprises, or defines a thermally conductive connection to, a mixing chamber of a dilution refrigerator.

This provides an advantage where the arrangement can be used to cool the sample to temperatures achievable with the dilution refrigerator, which may be in the order of only a few millikelvins.

According to a third aspect there is provided a method for handling a sample to be placed in a cryogenically cooled environment. The method comprises placing said sample into thermally conductive contact with a sample base in a sample cell that defines an openable and closable airtight enclosure, closing said enclosure, and evacuating said enclosure before placing the sample cell in said cryogenically cooled environment.

According to an embodiment, the method comprises protecting the sample with a priming chemical treatment. This provides an advantage where additional protection against environmental effects can be achieved, for example, if there are delays between sample fabrication and the evacuation of the enclosure.

According to an embodiment, the protecting in-wolves using hexamethyldisilazane for said priming chemical treatment. This provides an advantage where good protective priming can be achieved with known characteristics.

According to an embodiment, the method comprises storing the sample in said closed and evacuated enclosure for a storage period before placing the sample cell in said cryogenically cooled environment. This provides an advantage by keeping the sample safe from the effects of environmental conditions despite the length of the waiting period before the sample can be actually placed in the cryogenically cooled environment.

According to an embodiment, the method comprises establishing electric connections to and from said sample through airtight connectors between inside and outside of said enclosure. This provides an advantage where electric measurements and operations can be accomplished in the sample without having to open the enclosure and maintaining the sample within the protection offered by the sample cell.

According to an embodiment, the method comprises, before re-opening said enclosure, establishing pressure balance between inside and outside of said enclosure, and after said pressure balance has been established, opening said enclosure. This provides an advantage where the pressure difference between inside and outside of the enclosure does not make its handling more difficult at the step of opening the enclosure.

According to an embodiment, the step of evacuating the enclosure comprises closing an evacuation channel that comprises a conduit through a structure of said enclosure, and the method comprises re-opening said evacuation channel after said pressure balance has been established or as a part of establishing said pressure balance. This provides an advantage where a mechanically simple and functionally reliable way can be offered for implementing all operations that involve changing the pressure balance between inside and outside of said enclosure.

According to an embodiment, the re-opening of said evacuation channel comprises cleaning said conduit of sealing material that was used at a preceding method step to seal the evacuation channel when closed. This provides an advantage where the sample cell can be made ready for another round of use with only little work.

BRIEF DESCRIPTION OF THE DRAWINGS

The accompanying drawings, which are included to provide a further understanding of the invention and constitute a part of this specification, illustrate embodiments of the invention, and together with the description help to explain the principles of the invention. In the drawings.

DETAILED DESCRIPTION

Figure 1:
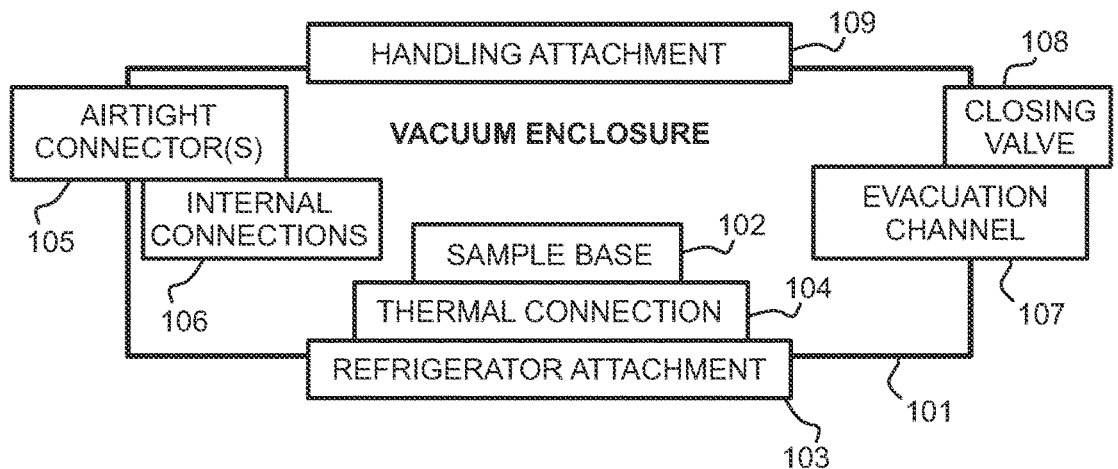
FIG. 1 illustrates a principle of a sample cell.

FIG. 1 illustrates schematically some examples of parts and features of a sample cell for holding a sample to be placed in a cryogenically cooled environment. The sample cell comprises an airtight, openable and closable enclosure 101 that is structurally strong and integral enough so that it can stand a pressure difference between atmospheric pressure on its outside and vacuum on its inside. The purpose of the vacuum inside the enclosure 101 is to minimize effects of atmospheric constituents on a sample that can be held enclosed in the enclosure 101 for long periods of time. The quality of the internal vacuum that the enclosure 101 is to withstand should be at least in the order of $10^3$ Pa, and possibly smaller such as down to $10^{-1}$ Pa for example. The periods of time for which a sample may be held in the enclosure 101 may be in the order of days, weeks, months, or even years, and the quality of the vacuum should not essentially deteriorate during such periods.

Within the enclosure 101, a sample base 102 is provided for receiving a sample. Examples of samples that the sample base 102 might receive include but are not limited to quantum computing chips such as quantum processor chips, quantum resonator chips and the like, typically attached to a piece of circuit board or a corresponding substrate. The sample base 102 may be structurally as simple as an essentially flat surface onto which the sample can be attached with attachment means such as screws, solder, ultrasonic welding, or thermally conductive glue.

The sample cell comprises a refrigerator attachment 103 for attaching, for example, the enclosure 101 of the sample cell to a refrigerated body of a cryogenically cooled environment. A thermal connection 104 exists between the sample base 102 and the refrigerator attachment 103 for conducting heat from a sample attached to the sample base 102 to the refrigerator attachment 103 and further to the refrigerated body of a cryogenically cooled environment. The meaning is to allow utilizing the cooling capability of the cryogenically cooled environment to bring the sample to as low temperature as possible, which is easiest if there is a chain of thermally well conducting materials and inter-faces all the way from the sample itself to the mechanism that cools the cryogenically cooled environment.

The refrigerator attachment 103 may be advantageous to implement in practice based on how the refrigerated body of the cryogenically cooled environment is configured. As an example, the refrigerated body of the cryogenically cooled environment offers a planar surface of certain size, to which samples and/or sample holders are to be attached. In such a case, the refrigerator attachment 103 may be a similar planar surface, possibly augmented with screw holes, spring-loaded connectors, and/or other ways of making and keeping a tight contact between the two planar surfaces. In another example, the refrigerated body of the cryogenically cooled environment may comprise one or more slots, one or more pegs, and/or one or more internal or external screw threads for attaching samples or sample holders. In such a case, it is advantageous to make the refrigerator attachment 103 comprise a corresponding set of pegs, slots, and/or external or internal screw threads for attaching the sample cell to the refrigerated body of the cryogenically cooled environment.

One or more airtight connectors 105 are provided for establishing electric connections between inside and outside of the enclosure 101. The airtight connectors 105 are provided for the purpose of conducting electric signals of desired kind and number to and/or from a sample that is held inside the enclosure 101. The airtight connectors 105, just as any other structural parts of the enclosure 101, should be sufficiently airtight to allow maintaining the desired quality of vacuum inside the enclosure 101 for those periods for which samples are to be held in the enclosure 101. At the same time, the airtight connectors 105 should be designed so that they allow conducting electric signals of the kind used in quantum computing applications. This may mean oscillating signals at frequencies on the order of several GHz, which may require the airtight connectors 105 to be coaxial, RF-rated connectors such as TNC or SMA connectors. Airtight connectors of this kind, manufactured and marketed for making hermetically sealed electric connections across bulkheads, are readily available from manufacturers such as Huber+Suhner, Pfaffikon, Switzerland, for example.

Internal connections 106 may be provided inside the enclosure 101 for allowing the conducting of electric signals between one or more of the airtight connectors 105 and a sample attached to the sample base 102. Such internal connections 106 should be constructed for adequate performance on the frequencies and signal energies that are to be expected, for example using RF-rated transmission lines.

The sample cell may comprise an evacuation channel 107 between inside and outside of the enclosure 101 for evacuating the enclosure 101 after closing. An evacuation channel 107 is not necessary if the desired quality of vacuum inside the enclosure 101 can be achieved through other means, for example by performing the closing of the enclosure 101 (after a sample has been attached to the sample base 102 and the necessary electric connections inside the enclosure 101 have been completed) under vacuum conditions, for example, in a glove box or a vacuum chamber with suitable built-in actuators. However, providing an evacuation channel 107 may create advantages in the form of simplifying the evacuation process. Examples of this are described in more detail later in this text.

If an evacuation channel 107 is provided, it may comprise a conduit through a structure of the enclosure 101, for example through one of its walls. The sample cell may comprise a closing valve 108 for selectively allowing and preventing flow of gaseous media through such a conduit. Such a structure allows keeping the closing valve 108 open for the time it takes to evacuate the sample cell, and then closing the closing valve 108 so that further flow of gaseous media through the conduit is prevented.

Figure 2:
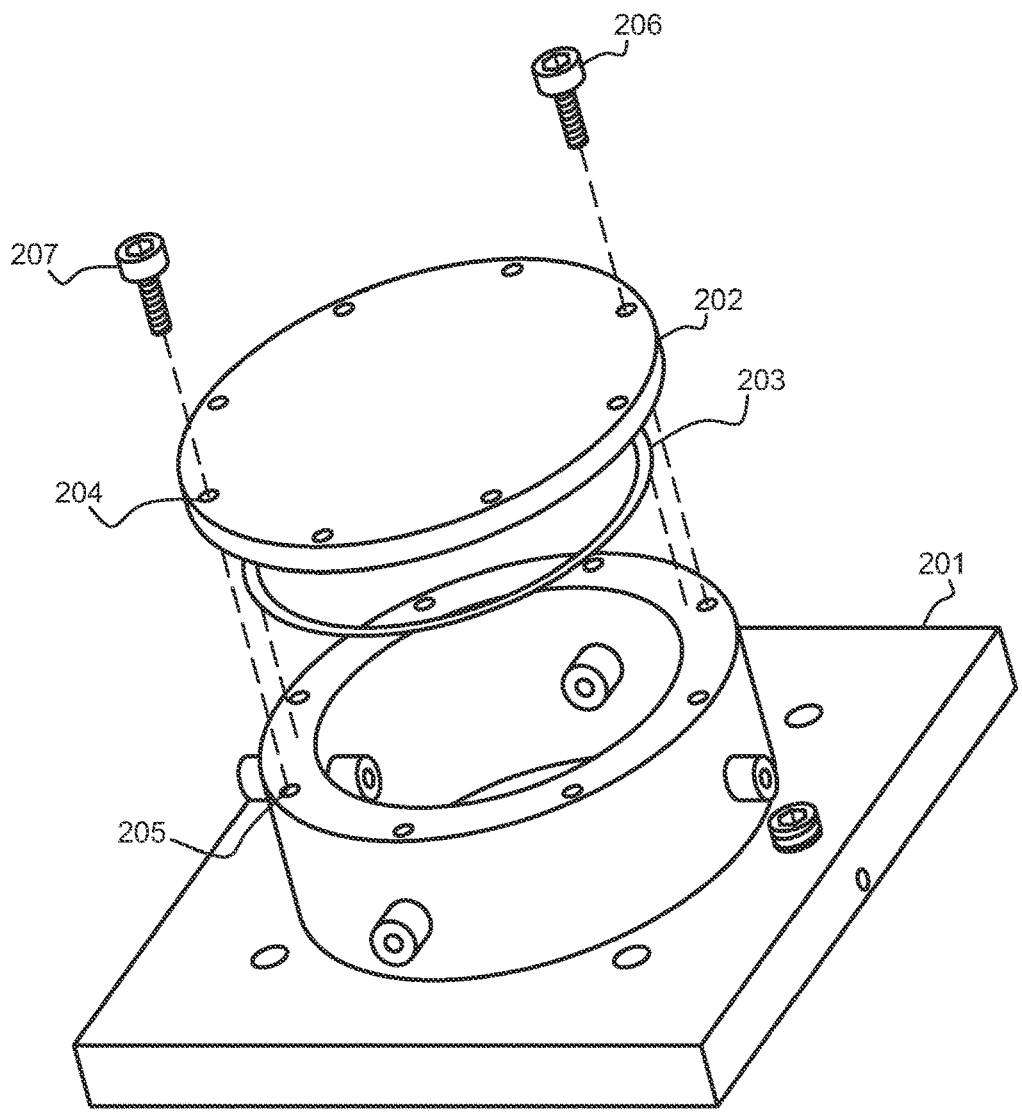
FIG. 2 illustrates an example embodiment of a sample cell.

FIG. 2 illustrates an example embodiment of a sample cell. The entity that has been described above as the enclosure 101 comprises a body part 201 and a lid part 202. The sample base (not shown in FIG. 2) is located in the body part 201. The lid part 202 is removably attached to the body part 201 to close an opening in the body part 201. In the embodiment shown in FIG. 2, the body part 201 comprises a base plate and a cylindrical housing, so that the base plate closes one end of the cylindrical housing and said opening is at the other end of the cylindrical housing. The lid part 202 is a round flange, the diameter of which matches the outer diameter of the cylindrical housing in the body part 201. A seal 203 can be placed between the lid part 202 and the body part 201. The seal 203 may be for example an indium seal, for the purpose of hermetic sealing and facilitating superconductive connection between the body part 201 and the lid part 202 when cooled to sufficiently low temperatures. Other possible materials of the seal include but are not limited to lead and various lead-indium alloys.

Matching screw holes are provided in both the lid part 202 and the body part 201; see screw holes 204 and 205 as an example. Two screws 206 and 207 are shown in FIG. 2 as examples. By placing screws similarly into all screw holes and tightening them evenly, the lid part 202 can be pressed tightly against the edges of the opening in the body part 201, squeezing the seal 203 therebetween, so that an airtightly closed enclosure is formed. This form of attaching underlines how a good sealing material should be relatively soft and deformable, and—if required—capable of becoming superconductive at those temperatures that are involved in using the sample cell and sample for measurements and/or operation.

It is advantageous to manufacture the basic structure of the sample cell (which in the embodiment of FIG. 2 means the body part 201 and the lid part 202) of a superconductive material. Calling a material superconductive means that the material is known to be capable of exhibiting superconductivity at temperatures at which the sample, for the holding of which the sample cells is used, is to be operated. Taken that in the applications meant here the sample is or at least comprises typically a quantum computing circuit, the temperatures at which the sample is to be operated are close to absolute zero, typically less than 1 K and in many cases as low as 10 mK or even lower. Superconductive materials suitable for manufacturing the basic structure of the sample cell include but are not limited to aluminum, niobium, tantalum, titanium, and superconductive alloys of these.

Manufacturing the basic structure of the sample cell of a superconductive material provides an advantage where the sample cell becomes an effective shield against external electromagnetic interference that could otherwise affect the sample during operation. This also means that the electromagnetic shielding of the sample becomes largely independent of what kind of shielding the structures of the cryogenically cooled environment could inherently offer. Maintaining good shielding all around the sample may require that also the seal 203 is made of electrically conductive or superconductive material. An example of an advantageous material for the seal 203 is indium, but it is also possible to utilize other materials that have effective sealing and conductive (or superconductive) properties.

Figure 3:
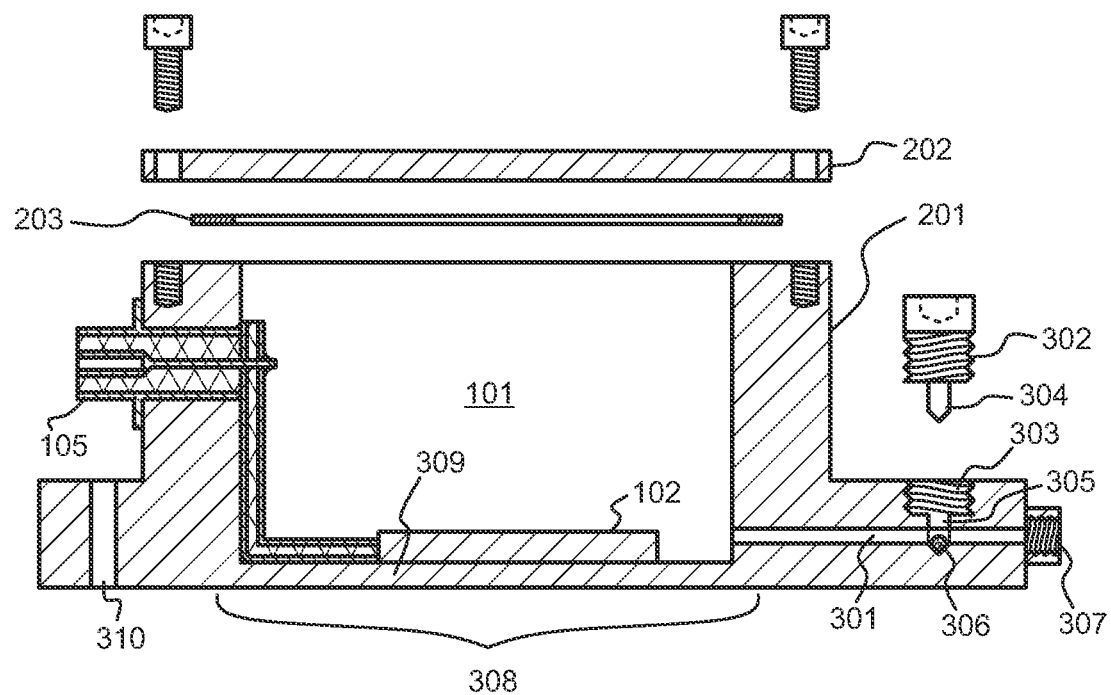
FIG. 3 illustrates an example embodiment of a sample cell in an open configuration without an inserted sample.

FIG. 3 illustrates a cross section of a sample cell of the kind shown in FIG. 2 above. In this embodiment, the evacuation channel is provided, and comprises a conduit 301 through a structure (here: through a part of the base plate of the body part 201) of the enclosure. The closing valve comprises a closing member 302 that is movable between an open position and a closed position. In the open position the closing member 302 allows gaseous media to flow through the conduit 301, and in the closed position the closing member 302 prevents gaseous media from flowing through the conduit 301.

In the embodiment shown in FIG. 3, the closing member 302 has the form of a threaded pin that fits in a cavity 303 located at an angle against the conduit 301. In this embodiment, the threaded cavity is at a right angle above the conduit 301 in the base plate and has internal threads. The matching threads of the closing member 302 and the cavity 303 mean that the former is arranged for longitudinal (here: vertical) movement in the threaded cavity 303 in response to turning on said threads. This longitudinal movement translates into similar longitudinal movement of the smaller diameter peg 304 at the lower end of the closing member 302 in the smaller diameter hole 305 that extends from the bottom of the cavity 303 further downwards, intersecting the conduit 301. The open position of the closing member 302 is one in which the smaller diameter peg 304 does not block the conduit 301, and the closed position of the closing member 302 is one in which the smaller diameter peg 304 is positioned in the smaller diameter hole 305 so that it blocks the conduit 301. FIG. 3 shows the closing member 302 completely out of the cavity 303 for graphical clarity, but it should be noted that in the open position, it can be on its threads in the cavity 303, although high enough for the smaller diameter peg 304 to not block the conduit 301.

In order to ensure complete and airtight blocking of the conduit when the closing member 302 is in its closed position, the sample cell may comprise a piece 306 of deformable sealing material at such part of the conduit 301 that the closing member 302 is arranged to occupy in its closed position. In the embodiment shown in FIG. 3, a small, preferably somewhat spherical piece of indium or other deformable sealing material has been placed on the bottom of the smaller diameter hole 305, where a recess may be provided for temporarily holding the piece 306 of deformable sealing material in place.

The longitudinal movement of the smaller diameter peg 304 in the smaller diameter hole 305, when the closing member 302 is turned on its threads, causes the piece 306 of deformable material to deform and fill all possible empty spaces around the smaller diameter peg 304 that could otherwise allow air to leak back into the evacuated enclosure.

In the embodiment of FIG. 3, a connector 307 is provided at the outer end of the conduit 301. The purpose of such a connector 307, if provided, is to make it easier to connect an inlet of a vacuum suction pump to the sample cell, for evacuating the sample cell after installing the sample and closing the lid.

In the embodiment of FIG. 3, the refrigerator attachment of the sample cell defines an essentially planar outer surface 308 of the sample cell. In the orientation shown in FIG. 3 this is the bottom surface of the sample cell. The sample base 102 is located on the bottom of the cylindrical void that is defined by the cylindrical housing and that extends partly into the base plate of the body part 201. The sample base 102 defines an essentially planar inner surface of the sample cell, said inner surface being parallel with said outer surface 308. The thermal connection that was described with reference designator 104 in FIG. 1 comprises a layer 309 of a thermally conductive material between said inner and outer surfaces. Just like with superconductivity above, calling a material thermally conductive means that the material remains thermally conductive in sub-kelvin temperatures. Aluminum is a good example, so if the basic structure of the sample cell is made of aluminum, the layer 309 of thermally conductive material may comprise the wall of the sample cell that is between the sample base 102 and the refrigerator attachment 103. Other materials that are known to be good thermal conductors in sub-kelvin temperatures include but are not limited to copper and gold.

Another example of a feature of the refrigerator attachment is the hole 310 in the base plate of the body part 201. A screw or other attachment means can be placed in the hole 310 for enabling a tight and thermally well conducting contact to a refrigerated body of the respective cryogenically cooled environment.

Figure 4:
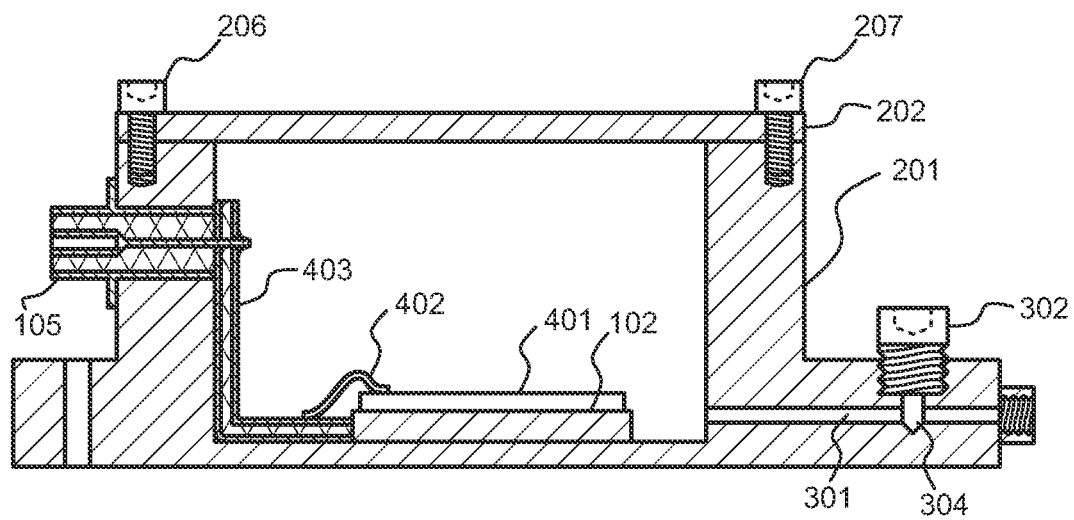
FIG. 4 illustrates the example embodiment of sample cell of FIG. 3 in a closed configuration with an inserted sample.

FIG. 4 is a cross section of a sample cell according to the embodiment of FIG. 3 in a closed configuration. A sample 401, such as a quantum computing chip or quantum resonator chip for example, has been attached to the sample base 102, and the necessary electric connections have been established between contact points of the sample 401 and the respective airtight connectors 105. In this embodiment, a bonding wire 402 connects a contact point (not separately shown) of the sample 401 to the appropriate conductor of a transmission line 403, the other end of which is in contact with the inner end of the airtight connector 105. The lid part 202 has been pressed against the upper edge of the cylindrical housing in the body part 201 by tightening the screws 206 and 207, so that the seal 203 that was visible in the exploded view of FIG. 3 is not visible any more. The closing member 302 has been turned all the way in on its threads, so that it prevents gaseous media from flowing through the conduit 301: the smaller diameter peg 304 fills completely the smaller diameter hole and thus blocks the conduit 301. If a piece of deformable sealing material such as that shown as piece 306 in FIG. 3 is used, the downward movement of the smaller diameter peg 304 squeezes the piece of deformable sealing material into thin layers that fill and seal all gaps that otherwise could allow air to leak through.

Figure 5:
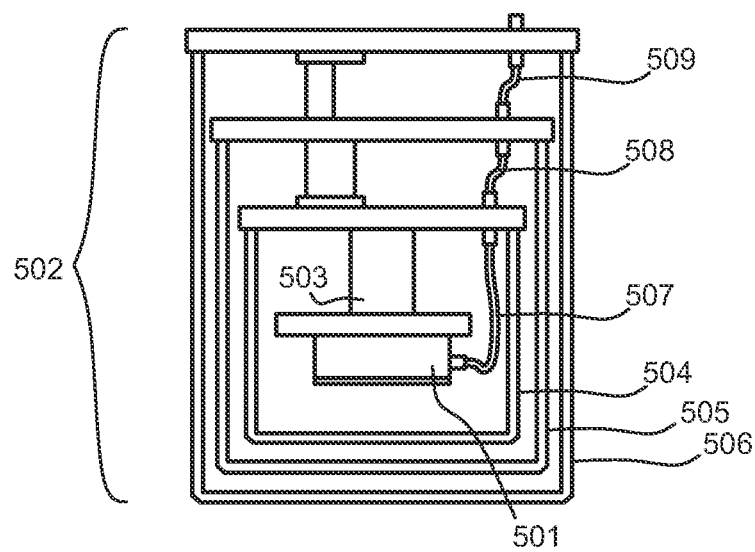
FIG. 5 illustrates an example of a sample cell in a cryogenically cooled environment.

FIG. 5 illustrates an example of an arrangement for cooling a sample in a cryogenically cooled environment. The sample is not itself visible in FIG. 5, because it is inside the sample cell 501. The cryogenic cooling apparatus 502 is a cryostat that comprises a refrigerated body 503, which in this case is the mixing chamber of a dilution refrigerator. The arrangement comprises a sample cell receiving surface of the refrigerated body 503 for receiving the sample cell 501 into thermally conductive contact with the refrigerated body 503. A set of radiation shields 504, 505, and 506 surrounds the innermost part of the cryostat, of which the outermost radiation shield 506 also constitutes a part of the vacuum can that encloses the inner parts of the cryostat. A special kind of cabling 507, 508, and 509 is used between the various stages of the arrangement so that signals can be conveyed in both directions between the sample and the surrounding room temperature environment. In this embodiment, the ends of the innermost cables 507 may be connected to the airtight connectors that form part of the sample cell 501.

Figure 6:
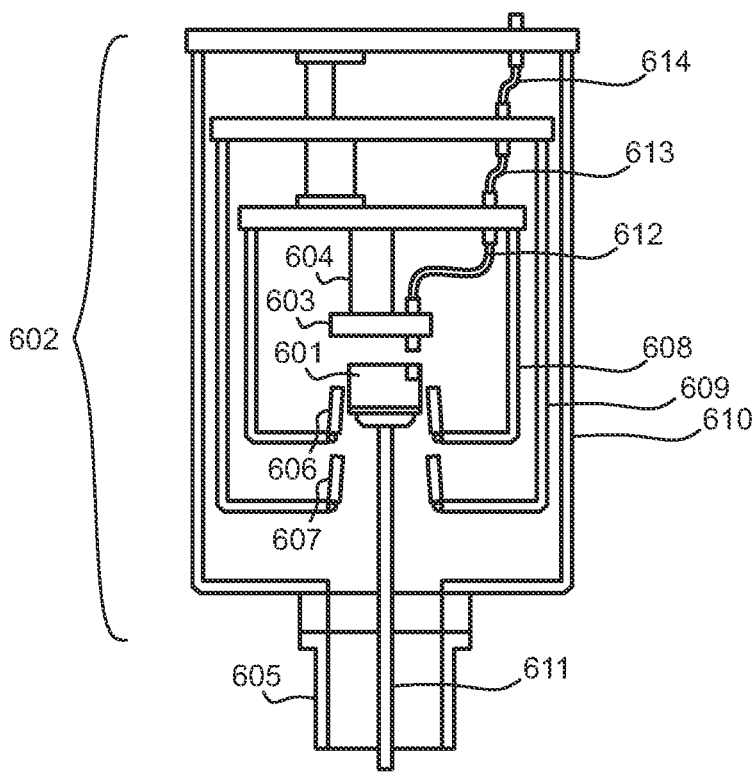
FIG. 6 illustrates an example of inserting a sample cell into a cryogenically cooled environment.

FIG. 6 illustrates another example of an arrangement for cooling a sample in a cryogenically cooled environment. The sample is inside the sample cell 601. The cryogenic cooling apparatus 602 is a cryostat that comprises a refrigerated body 603, which in this case is a cold plate that comprises a thermally conductive connection to a mixing chamber of a dilution refrigerator 604. A surface of the cold plate serves as the sample cell receiving surface of the refrigerated body 603 for receiving said sample cell 601 into thermally conductive contact with the refrigerated body 603.

The arrangement of FIG. 6 differs from that of FIG. 5 in that the cryostat is equipped with a so-called sample changer, which comprises an airlock 605 and a set of openable and closable baffles 606 and 607 in the radiation shields 608, 609, and 610. An elongated probe 611 can be used to bring the sample cell 601 in through the airlock 605 and through concentric openings in the radiation shields 608, 609, and 610. The airtight connectors in the sample cell 601 engage with matching connectors in the refrigerated body 603 upon the sample cell 601 making contact with and becoming attached to the refrigerated body 603, so in this embodiment the cabling 612, 613, and 614 run only between the fixed stages of the cryostat. The attachment between the sample cell 601 and the upper end of the probe 611 can be disconnected, at least to the extent of not conducting heat, once the sample cell 601 is in place so that the thermal conductivity of the probe does not load the cooling capacity of the cryostat.

Figure 7:
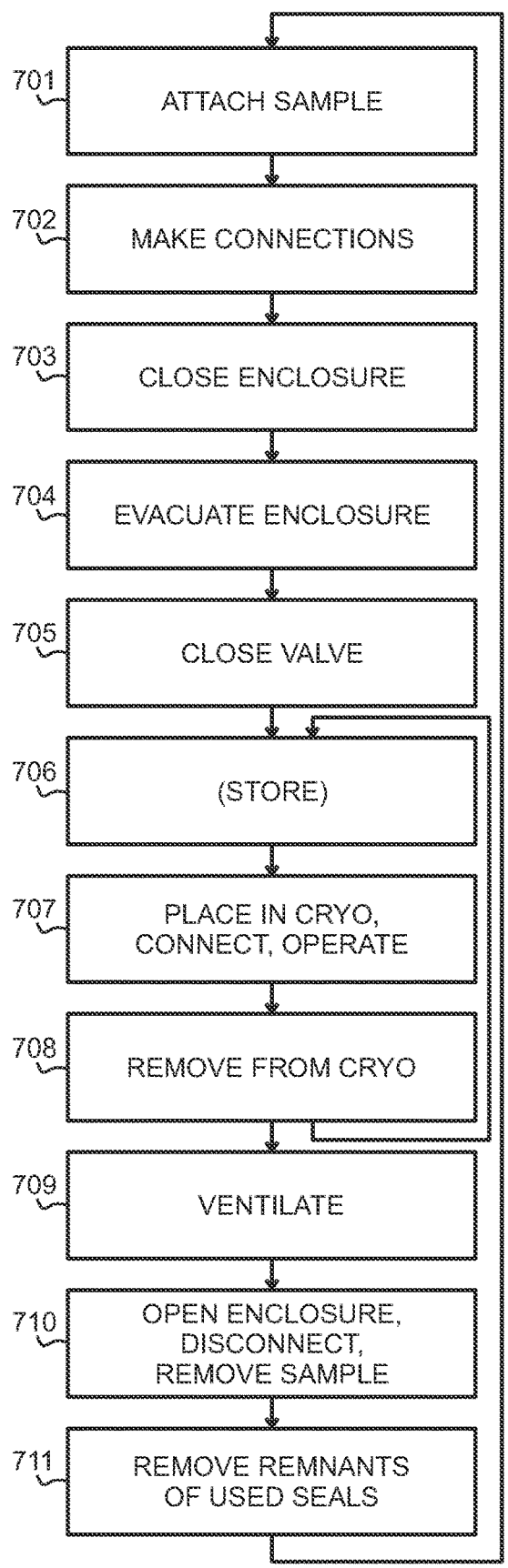
FIG. 7 illustrates a method.

FIG. 7 illustrates an example of a method for handling a sample to be placed in a cryogenically cooled environment. Step 701 of the method comprises placing the sample into thermally conductive contact with a sample base in a sample cell that defines an openable and closable airtight enclosure. The sample cell is preferably of the kind described in at least one of the embodiments above. In a typical case, electrical connections are made to and from the sample, so the method of FIG. 7 comprises making such connections in step 702, for example by wire bonding as was described earlier with reference to FIG. 4.

Step 703 comprises closing the enclosure, for example by screwing a lid part over an opening of a housing in a body part. Step 704 comprises evacuating the enclosure before placing the sample cell in the cryogenically cooled environment. If the sample cell is of the kind shown in FIGS. 3 and 4, this can be accomplished by connecting the inlet of a vacuum suction pump to the connector at the outer end of the conduit in the base part and allowing the pump to run until the vacuum at its inlet is of sufficient quality. Step 705 comprises preventing further flow of gaseous media through the conduct by closing an associated valve, for example by turning the threaded closing member of FIGS. 3 and 4 all the way in on its threads.

If the sample does not need to be operated immediately, the method may comprise storing the sample in the closed and evacuated enclosure for a storage period before placing the sample cell in the cryogenically cooled environment, as shown as step 706 in FIG. 7. Eventually the sample cell with the sample inside is placed in the cryogenically cooled environment as shown as step 707 in FIG. 7. Step 707 comprises also establishing electrical connections to and from the sample through airtight connectors between inside and outside of the enclosure. Additionally step 707 may be interpreted to comprise all those steps that belong to a method for performing measurements in the cryogenically cooled environment, including but not being limited to evacuating and cooling down the cryostat, subjecting the sample to input signals, and collecting output signals from the sample.

When no further operation of the sample in the cryogenically cooled environment is intended, the sample cell is removed from the cryogenically cooled environment as shown as step 708 in FIG. 7. This step may include sub-steps that may be necessary for ventilating and thermalizing the cryostat, or for using a probe to detach and remove a sample cell through a sample changer. The possible return path from step 708 to step 706 means that at least in some cases the sample could be stored for further measurements, for transportation, and/or for some other purpose without opening the sample cell at this time. Step 709 comprises, before re-opening the enclosure, establishing a pressure balance between inside and outside of the enclosure. This can be done for example by opening a valve that closes a conduit through which the enclosure was evacuated, and/or loosening a screw or other attachment means that holds a lid part or other kind of an openable part in place. After said pressure balance has been established, the method comprises opening the enclosure at step 710. The sample can now be disconnected from any electric connections internal to the enclosure, and removed from the enclosure.

The sample cell is intended to be reusable. Therefore, while steps 704 and 705 involved evacuating the enclosure through an evacuation channel and subsequently closing the evacuation channel (which comprises a conduit through a structure of the enclosure), the method comprises re-opening said evacuation channel after pressure balance has been established (or as a part of establishing said pressure balance) between inside and outside of the enclosure. In FIG. 7, there is a step 711, which comprises removing remnants of used seals, such as the seal 203 and the piece 306 of deformable sealing material. The remnants of the seal 203 may be removed by scrubbing the appropriate surfaces of the body part and the lid part. The remnants of the piece 306 of deformable sealing material may be removed by running a suitable cleaning instrument through the conduit 301. The last-mentioned may be constitute a part of the step where pressure balance is established between inside and outside of the enclosure before re-opening the enclosure: running the cleaning instrument through the conduit may clear the way for surrounding air to flow in and fill the enclosure.

Figure 8:
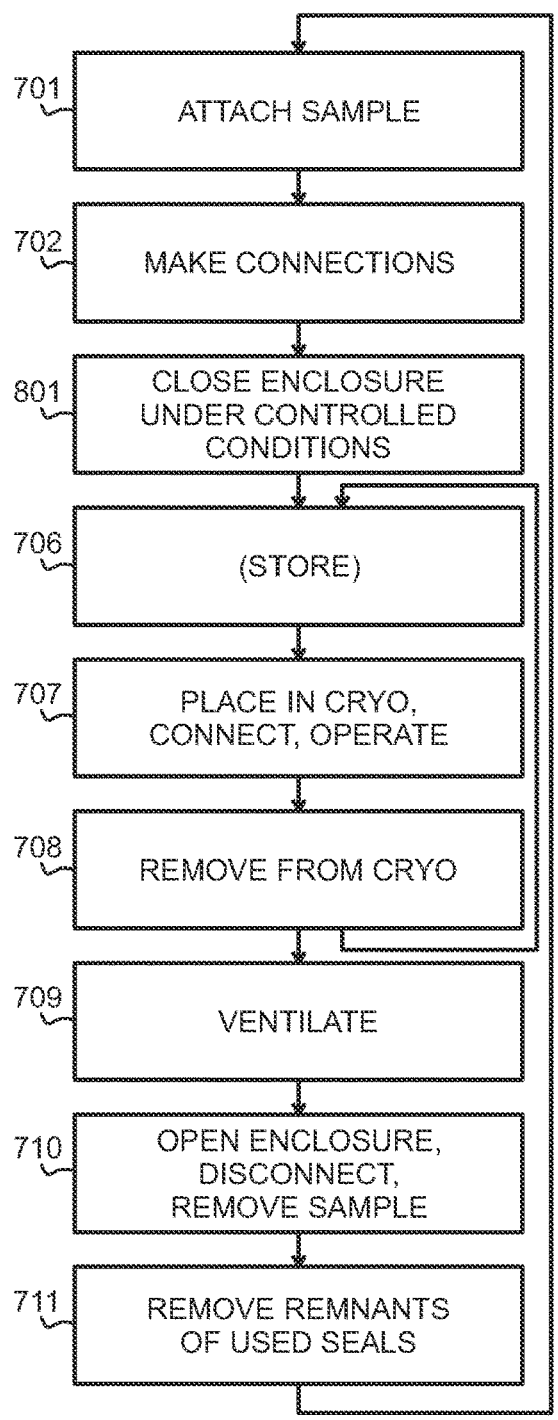
FIG. 8 illustrates a method.

FIG. 8 illustrates another embodiment of a method for handling a sample to be placed in a cryogenically cooled environment. In FIG. 8 it is assumed that either the sample cell does not comprise an evacuation channel, or for some purpose it is not used but it is kept closed at all times. Those steps in the method of FIG. 8 that are the same as corresponding steps in FIG. 7 are numbered with the same reference designators and need not be described in more detail here. After the electric connections internal to the sample cell have been completed in step 702, the sample cell is closed under controlled conditions, like a controlled atmosphere or vacuum conditions for example, at step 801. This can be accomplished for example by placing the parts of the still open sample cell in a controlled environment such as a glove box, in which environmental parameters are carefully controlled: as an example, oxygen and humidity levels may be substantially reduced compared to atmospheric conditions, and/or the controlled environment may involve vacuum conditions. One may then utilize any available manipulating means to close and seal the enclosure in the special conditions that prevail in the controlled environment. If a vacuum chamber with suitable mechanical manipulators is available, it can be used as a controlled environment in step 801. Otherwise the method in FIG. 8 is similar to that of FIG. 7, with the possible exception that if at least one of steps 709, 710, or 711 in FIG. 7 involved removing remnants of sealing material from the evacuation channel, a corresponding part of the similarly numbered step may not be needed in FIG. 8 if there was no evacuation channel or if it was not to be used either during the next reuse of the sample cell.

Figure 9:
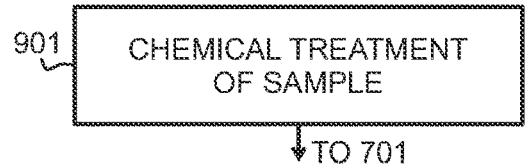
FIG. 9 illustrates a possible additional step in a method.

FIG. 9 illustrates how any of the methods of FIG. 7 or 8 may comprise protecting the sample with a priming chemical treatment at step 901. This may be done early in the process, for example, before placing the sample into thermally conductive contact with the sample base in the sample cell. The priming chemical treatment may protect the sample against harmful environmental effects, for example, if there occurs a delay before the sample cell can be closed and evacuated. An example of a chemical suitable for a priming chemical treatment is hexamethyldisilazane (HMDS), which has the property of evaporating when evacuated, so it is practical for providing protection under the period during which the sample would otherwise be subjected to the atmospheric conditions of a normal indoor environment.

It is obvious to a person skilled in the art that with the advancement of technology, the basic idea of the invention may be implemented in various ways. The invention and its embodiments are thus not limited to the examples described above, instead they may vary within the scope of the claims.

The invention is claimed as follows:

1. A sample cell for holding a sample to be placed in a cryogenically cooled environment, the sample cell comprising:
an enclosure adapted to be opened and closed, wherein the enclosure is airtight when closed;
a sample base positioned within the enclosure for receiving the sample;
a refrigerator attachment for attaching the sample cell to a refrigerated body of the cryogenically cooled environment;
a thermal connection between the sample base and the refrigerator attachment;
one or more airtight connectors for establishing electric connections between an inside and an outside of the enclosure;
a conduit extending between the inside and the outside of the enclosure, and through a structure of the enclosure;
a connector positioned at a first end of the conduit adjacent to the outside of the enclosure for connecting an inlet of a vacuum suction pump to the sample cell, the vacuum suction pump used to evacuate the enclosure when the enclosure is closed;
a closing valve for selectively allowing and preventing a flow of gaseous media through the conduit, wherein the closing valve comprises a closing member movable between: (i) an open position in which gaseous media is allowed to flow through the conduit, and (ii) a closed position in which gaseous media is prevented from flowing through the conduit; and
a piece of deformable sealing material compliant with vacuum and cryogenically cooled conditions arranged at a position along the conduit corresponding to a position of the closing valve, such that a portion of the closing member contacts the piece of deformable sealing material when in the closed position to create a seal.

2. The sample cell of claim 1, wherein:
the closing valve comprises a cavity arranged at an angle with respect to the conduit, the cavity comprising threads; and
the closing member comprises a threaded pin arranged for longitudinal movement in the threaded cavity in response to turning on the threads.

3. The sample cell of claim 1, wherein:
the refrigerator attachment defines an essentially planar outer surface of the sample cell;
the sample base defines an essentially planar inner surface of the sample cell, the inner surface being parallel with the outer surface; and
the thermal connection comprises a layer of a thermally conductive material between the inner and outer surfaces.

4. The sample cell of claim 3, wherein the thermally conductive material is a material that remains thermally conductive in sub-kelvin temperatures.

5. The sample cell of claim 4, wherein the thermally conductive material comprises at least one of aluminum, copper, or gold.

6. The sample cell of claim 1, wherein the enclosure comprises:
a body in which the sample base is located; and
a lid removably attached to the body to close an opening in the body.

7. The sample cell of claim 6, further comprising an electrically conductive seal between the body and the lid.

8. The sample cell of claim 7, wherein said electrically conductive seal is made of a superconductive material.

9. The sample cell of claim 1, wherein the sample cell is made of a superconductive material.

10. The sample cell of claim 1, further comprising a handling attachment for removably attaching the sample cell to a probe for inserting the sample cell into a cryogenic cooling apparatus.

11. An arrangement for cooling a sample in a cryogenically cooled environment, the arrangement comprising:
    a sample cell;
    a cryogenic cooling apparatus that comprises a refrigerated body; and
    a sample cell receiving surface of the refrigerated body for receiving the sample cell into thermally conductive contact with the refrigerated body,
    wherein the sample cell comprises:
        an enclosure adapted to be opened and closed, wherein the enclosure is airtight when closed,
        a sample base positioned within the enclosure for receiving the sample,
        a refrigerator attachment for attaching the sample cell to the refrigerated body,
        a thermal connection between the sample base and the refrigerator attachment,
        one or more airtight connectors for establishing electric connections between an inside and an outside of the enclosure
        a conduit extending between the inside and the outside of the enclosure, and through a structure of the enclosure;
        a connector positioned at a first end of the conduit adjacent to the outside of the enclosure for connecting an inlet of a vacuum suction pump to the sample cell, the vacuum suction pump used to evacuate the enclosure when the enclosure is closed;
        a closing valve for selectively allowing and preventing a flow of gaseous media through the conduit, wherein the closing valve comprises a closing member movable between: (i) an open position in which gaseous media is allowed to flow through the conduit, and (ii) a closed position in which gaseous media is prevented from flowing through the conduit; and
        a piece of deformable sealing material compliant with vacuum and cryogenically cooled conditions arranged at a position along the conduit corresponding to a position of the closing valve, such that a portion of the closing member contacts the piece of deformable sealing material when in the closed position to create a seal.

12. The arrangement of claim 11, wherein the refrigerated body comprises, or defines a thermally conductive connection to, a mixing chamber of a dilution refrigerator.

13. A method for handling a sample to be placed in a cryogenically cooled environment, the method comprising:
    placing the sample into thermally conductive contact with a sample base in a sample cell that defines an openable and closable airtight enclosure;
    closing the sample cell;
    connecting a vacuum suction pump to the sample cell via a connector on an outer surface of the sample cell, wherein the connector is positioned at a first end of a conduit that extends from an interior of the sample cell to an exterior of the sample cell;
    actuating a closing valve into an open position to allow a flow of gaseous media through the conduit, wherein the closing valve comprises a closing member movable between: (i) the open position, and (ii) a closed position in which gaseous media is prevented from flowing through the conduit;
    evacuating the enclosure before placing the sample cell in the cryogenically cooled environment by operating the vacuum suction pump; and
    actuating the closing valve into the closed position to prevent the flow of gaseous media through the conduit, wherein a portion of the closing member contacts a piece of deformable sealing material arranged at a position along the conduit corresponding to a position of the closing valve when in the closed position to create a seal.

14. The method of claim 13, further comprising protecting the sample with a priming chemical treatment.

15. The method of claim 14, wherein said protecting involves using hexamethyldisilazane for the priming chemical treatment.

16. The method of claim 13, further comprising storing the sample in the closed and evacuated enclosure for a storage period before placing the sample cell in the cryogenically cooled environment.

17. The method of claim 13, further comprising establishing electric connections to and from the sample through airtight connectors between the interior and the exterior of the enclosure.

18. The method of claim 13, further comprising:
    before re-opening the enclosure, establishing pressure balance between the interior and the exterior of the enclosure; and
    after said pressure balance has been established, opening the enclosure.

19. The method of claim 18,
    further comprising re-opening the conduit after the pressure balance has been established or as a part of establishing the pressure balance.

20. The method of claim 19, wherein the re-opening of the conduit comprises cleaning the conduit of the deformable sealing material.

* * * * *